United States Patent
Liu

(10) Patent No.: US 11,371,150 B2
(45) Date of Patent: Jun. 28, 2022

(54) COATING AND COATED CUTTING TOOL COMPRISING THE COATING

(71) Applicant: Kennametal Inc., Latrobe, PA (US)

(72) Inventor: Zhenyu Liu, Latrobe, PA (US)

(73) Assignee: KENNAMETAL INC., Latrobe, PA (US)

(*) Notice: Subject to any disclaimer, the term of this patent is extended or adjusted under 35 U.S.C. 154(b) by 167 days.

(21) Appl. No.: 16/734,329

(22) Filed: Jan. 4, 2020

(65) Prior Publication Data

US 2021/0207273 A1 Jul. 8, 2021

(51) Int. Cl.
| | |
|---|---|
| *C23C 16/40* | (2006.01) |
| *C23C 28/04* | (2006.01) |
| *C23C 16/36* | (2006.01) |
| *C23C 16/32* | (2006.01) |
| *C23C 16/34* | (2006.01) |
| *B23C 5/16* | (2006.01) |

(52) U.S. Cl.
CPC .............. *C23C 28/044* (2013.01); *B23C 5/16* (2013.01); *C23C 16/32* (2013.01); *C23C 16/34* (2013.01); *C23C 16/36* (2013.01); *C23C 16/403* (2013.01); *C23C 16/405* (2013.01); *C23C 28/042* (2013.01); *B23C 2228/10* (2013.01)

(58) Field of Classification Search
CPC ... C23C 16/403; C23C 16/405; C23C 28/042; C23C 28/044
USPC .......................................... 428/697, 701, 702
See application file for complete search history.

(56) References Cited

U.S. PATENT DOCUMENTS

| | | | |
|---|---|---|---|
| 3,837,896 A | 9/1974 | Lindstrom et al. | |
| 4,180,400 A * | 12/1979 | Smith | B23B 27/148 |
| | | | 428/469 |
| 4,701,384 A | 10/1987 | Sarin et al. | |
| 4,852,999 A | 8/1989 | Mehrotra et al. | |
| 4,959,331 A | 9/1990 | Mehrotra et al. | |
| 4,959,332 A | 9/1990 | Mehrotra et al. | |
| 4,960,735 A | 10/1990 | Mehrotra et al. | |
| 5,141,901 A | 8/1992 | Brandt | |
| 5,264,297 A | 11/1993 | Jindal et al. | |
| 5,422,140 A | 6/1995 | Collin | |
| 5,449,647 A | 9/1995 | Brandt | |

(Continued)

FOREIGN PATENT DOCUMENTS

| | | |
|---|---|---|
| DE | 112014001562 B4 | 8/2019 |
| GB | 1544436 A | 4/1979 |
| WO | 2008/043606 A1 | 4/2008 |

OTHER PUBLICATIONS

J. Musil, Hard nanocomposite coatings: Thermal stability, oxidation resistance and toughness, Surface & Coatings Technology, May 26, 2012, pp. 50-65, vol. 207.

(Continued)

*Primary Examiner* — Archene A Turner
(74) *Attorney, Agent, or Firm* — Larry R. Meenan

(57) ABSTRACT

A coating includes a layer having an alumina matrix and at least one of zirconia grains and hafnia grains in the alumina matrix. An average grain size of the at least one of the zirconia grains and hafnia grains is 100 nm or less. A coated cutting tool includes a substrate and the coating bonded to the substrate. The substrate has a rake face, a flank face, and a cutting edge formed at the intersection of the rake face and the flank face.

20 Claims, 8 Drawing Sheets

(56) References Cited

U.S. PATENT DOCUMENTS

| | | | |
|---|---|---|---|
| 5,827,570 A * | 10/1998 | Russell | C23C 16/40 427/255.34 |
| 6,224,968 B1 | 5/2001 | van den Berg et al. | |
| 6,447,896 B1 | 9/2002 | Augustine | |
| 6,660,371 B1 * | 12/2003 | Westphal | C23C 16/30 428/216 |
| 6,726,987 B2 * | 4/2004 | Kathrein | C23C 16/40 428/336 |
| 7,217,674 B2 | 5/2007 | Yeckley et al. | |
| 7,322,776 B2 | 1/2008 | Webb et al. | |
| 7,326,461 B2 * | 2/2008 | Sottke | C04B 41/009 428/216 |
| 7,581,906 B2 | 9/2009 | Fang et al. | |
| 7,968,182 B2 * | 6/2011 | Trinh | C23C 28/044 428/325 |
| 8,080,323 B2 | 12/2011 | Ban et al. | |
| 8,652,638 B2 | 2/2014 | Webb et al. | |
| 9,181,620 B2 | 11/2015 | Wendt et al. | |
| 9,365,925 B2 | 6/2016 | Leicht et al. | |
| 9,371,580 B2 | 6/2016 | Liu et al. | |
| 9,650,714 B2 | 5/2017 | Liu et al. | |
| 9,719,175 B2 | 8/2017 | Liu et al. | |
| 9,764,986 B2 | 9/2017 | Liu et al. | |
| 9,890,084 B2 | 2/2018 | Liu et al. | |
| 10,100,405 B2 | 10/2018 | Cooper et al. | |
| 2004/0228694 A1 | 11/2004 | Webb et al. | |
| 2005/0260454 A1 | 11/2005 | Fang et al. | |
| 2006/0188348 A1 | 8/2006 | Yeckley et al. | |
| 2009/0004440 A1 | 1/2009 | Ban et al. | |
| 2011/0020081 A1 | 1/2011 | Webb et al. | |
| 2016/0160347 A1 * | 6/2016 | Liu | C23C 16/32 428/336 |
| 2016/0305018 A1 | 10/2016 | Cooper et al. | |
| 2017/0001267 A1 | 1/2017 | Grunder et al. | |
| 2018/0057934 A1 | 3/2018 | Cooper et al. | |
| 2018/0347027 A1 | 12/2018 | Kumar et al. | |
| 2018/0371610 A1 | 12/2018 | Banerjee et al. | |

OTHER PUBLICATIONS

Per Martensson, Influence of the concentration of ZrCl4 on texture, morphology and growth rate of CVD grown α-Al2O3 coatings deposited by the AlCl3/ZrCl4/H2/CO2/H2S process, Surface & Coatings Technology, Mar. 15, 2006, pp. 3626-3632, vol. 200.

W.C. Russell et al., Wear characteristics and performance of composite alumina-zirconia CVD coatings, International Journal of Refractory Metals and Hard Materials, 1996, pp. 51-58, vol. 14.

Quinto, D.T. et al., Mechanical Properties, Structure and Performance of Chemically Vapor-deposited and Physically Vapor-deposited Coated Carbide Tools, Materials Science and Engineering, A105/106, 1988, pp. 443-452.

* cited by examiner

COATING AND COATED CUTTING TOOL COMPRISING THE COATING

FIELD

The present application relates to the field of coatings, and, in particular, coatings for cutting tools.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by chemical vapor deposition (CVD) and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one embodiment, a coating includes a layer having an alumina matrix and at least one of zirconia grains and hafnia grains in the alumina matrix. An average grain size of the at least one of the zirconia grains and hafnia grains is 100 nm or less.

The average grain size of the at least one of the zirconia grains and hafnia grains may be in a range of 1 nm to 80 nm.

The average grain size of the at least one of the zirconia grains and hafnia grains may be in a range of 1 nm to 40 nm.

The average grain size of the at least one of the zirconia grains and hafnia grains may be in a range of 40 nm to 80 nm.

The at least one of the zirconia grains and hafnia grains may include grains having at least one of a tetragonal, monoclinic, and orthorhombic crystal structure.

The at least one of the zirconia grains and hafnia grains may be primarily disposed within grains of the alumina matrix.

The at least one of the zirconia grains and hafnia grains may be primarily disposed at grain boundaries of the alumina matrix.

The layer may have a thickness of 0.1 μm to 25 μm.

In another embodiment, a coated cutting tool includes a substrate and a coating bonded to the substrate. The substrate has a rake face, a flank face, and a cutting edge formed at the intersection of the rake face and the flank face. The coating includes a layer having an alumina matrix and at least one of zirconia grains and hafnia grains in the alumina matrix. An average grain size of the at least one of the zirconia grains and hafnia grains is 100 nm or less.

The average grain size of the at least one of the zirconia grains and hafnia grains may be in a range of 1 nm to 80 nm.

The average grain size of the at least one of the zirconia grains and hafnia grains may be in a range of 1 nm to 40 nm.

The average grain size of the at least one of the zirconia grains and hafnia grains may be in a range of 40 nm to 80 nm.

The at least one of the zirconia grains and hafnia grains may include grains having at least one of a tetragonal, monoclinic, and orthorhombic crystal structure.

In an aspect, the at least one of the zirconia grains and hafnia grains may be primarily disposed within grains of the alumina matrix.

The at least one of the zirconia grains and hafnia grains may be primarily disposed at grain boundaries of the alumina matrix.

The layer may have a thickness of 0.1 μm to 25 μm.

Other embodiments of the disclosed coating and coated cutting tool will become apparent from the following detailed description, the accompanying drawings and the appended claims.

DETAILED DESCRIPTION

Figure 1:
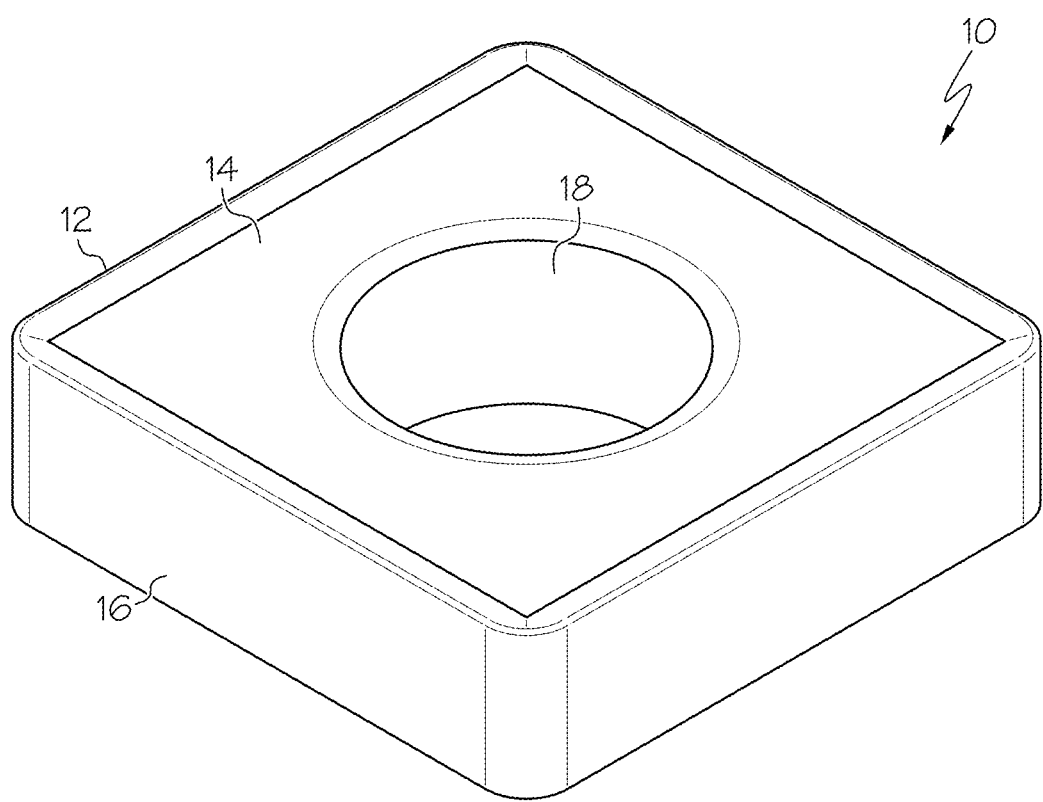
FIG. 1 illustrates a cutting insert substrate according to an example of the present description.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present description. Numerous modifications and adaptations will be readily apparent to those of skill in the art without departing from the spirit and scope of the present description.

According to the present description, a coating includes a layer having an alumina matrix and at least one of zirconia grains and hafnia grains in the alumina matrix. The coating may be a single layer coating on a substrate or may be a multilayer coating on a substrate with at least one layer having an alumina matrix and at least one of zirconia grains and hafnia grains in the alumina matrix and optionally one or more other layers.

The alumina matrix is oxidation-resistant even at high temperature. Pure alumina is susceptible to cracking. The at least one of zirconia grains and hafnia grains in the alumina matrix are added to the alumina matrix to increase a crack propagation resistance of the alumina matrix.

An average grain size of the at least one of the zirconia grains and hafnia grains is 100 nm or less. The small grain size of the at least one of the zirconia grains and hafnia grains can provide high hardness based on Hall-Petch effects. At the same time, the grain refinement can make formed zirconia in a preferable phase, such as tetragonal. Then this phase may eventually contribute to toughening the alumina matrix. Preferably, the average grain size of the at least one of the zirconia grains and hafnia grains may be in a range of 1 nm to 80 nm. For example, the average grain size of the at least one of the zirconia grains and hafnia grains may be in a range of 1 nm to 40 nm, or the average grain size of the at least one of the zirconia grains and hafnia grains may be in a range of 40 nm to 80 nm.

The at least one of the zirconia grains and hafnia grains may include grains having a tetragonal, monoclinic, or orthorhombic crystal structure. The zirconia grains or hafnia grains refined to the nanoscale prefer formation of the tetragonal crystal structure. Tetragonal phase is preferred to be more desirable for toughening the alumina matrix.

The at least one of the zirconia grains and hafnia grains may be primarily disposed within grains of the alumina matrix, or the at least one of the zirconia grains and hafnia grains may be primarily disposed at grain boundaries of the alumina matrix. Positioning the at least one of the zirconia grains and hafnia grains within grains of the alumina matrix is beneficial for toughening the alumina matrix against intragranular cracking. Positioning the at least one of the zirconia grains and hafnia grains at grain boundaries of the alumina matrix is beneficial for toughening the alumina matrix against intergranular cracking. The strengthening mechanism may be based on grain boundary strengthening due to the dispersed nanoscale secondary phase of zirconia. Positioning of the at least one of the zirconia grains and hafnia grains may be determined based on the overall architecture of the coating. The positioning of the at least one of the zirconia grains and hafnia grains can be selected by control of the deposition conditions.

An average grain size of the alumina matrix is greater than the average grain size of the at least one of the zirconia grains and hafnia grains. In an aspect, the average grain size of the alumina matrix is 200 nm or greater. In another aspect, the average grain size of the alumina matrix is 500 nm or greater. In yet another aspect, the average grain size of the alumina matrix is 1 micron or greater. Though, a small average grain size of the alumina matrix is preferable.

The layer having the alumina matrix and the at least one of zirconia grains and hafnia grains in the alumina matrix may have any thickness not inconsistent with the objectives of the coating. For example, the layer may have a thickness of 0.1 μm to 25 μm.

The layer having the alumina matrix and the at least one of zirconia grains and hafnia grains in the alumina matrix may the coated in any manner not inconsistent with the objectives of the present description.

The present description provides the following approaches to prepare the layer using chemical vapor deposition (CVD).

Figure 2A:
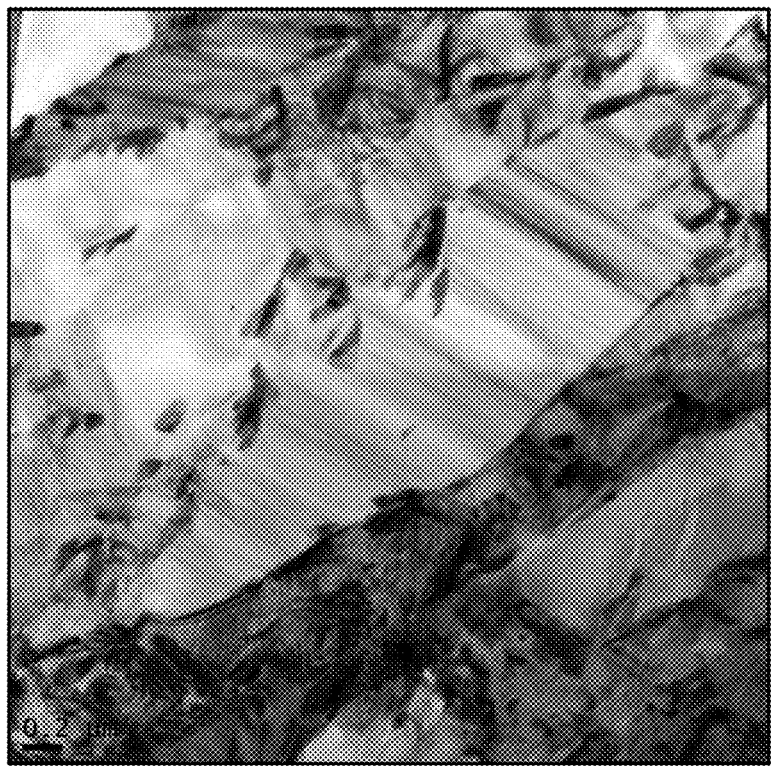
FIGS. 2A and 2B are TEM images of the $Al_2O_3$—$ZrO_2$ nanocomposite coatings of the present description.
Figure 2B:
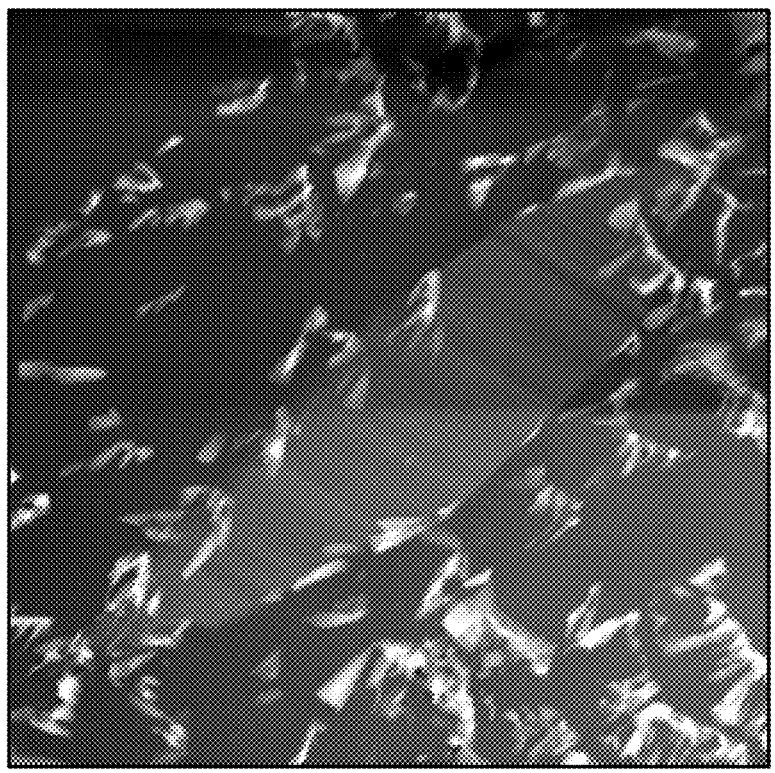

By controlling zirconium introduction manners, selection of Al/Zr introduction ratios and other processing conditions, a uniformly distributed $ZrO_2$ grain in nanoscale (less than 100 nm at least in one dimension) can be produced. In one case, the formed $ZrO_2$ grains prefer to precipitate/segregate on the grain boundary. In the other case, the formed $ZrO_2$ grains can be uniformly included into the $Al_2O_3$ matrix to form mixed $Al_2O_3$—$ZrO_2$ composite grains with alternative deposition conditions. As shown in FIGS. 2A and 2B, transmission electron microscopy (TEM) observation has determined that $ZrO_2$ grains have been formed in the range of 50 nm to a few 10 s nm.

Figure 3A:
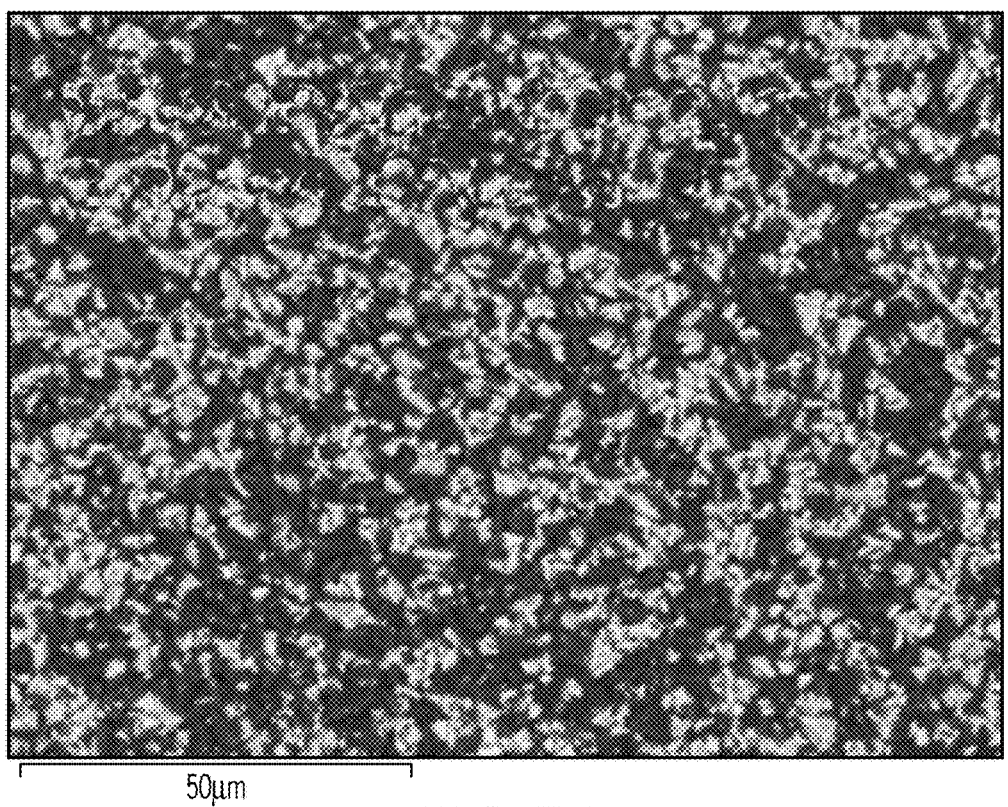
FIGS. 3A, 3B, and 3C are SEM images of micron scale $ZrO_2$ formed with continuous introduction of Zr into a coating system.
Figure 3B:
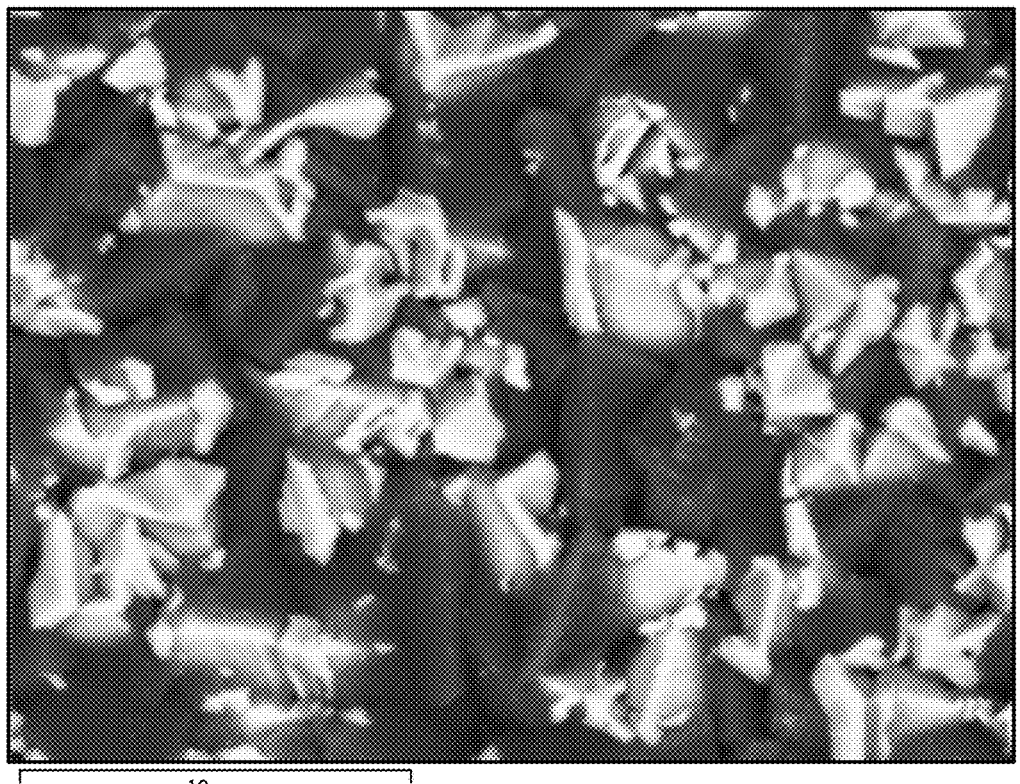
Figure 3C:
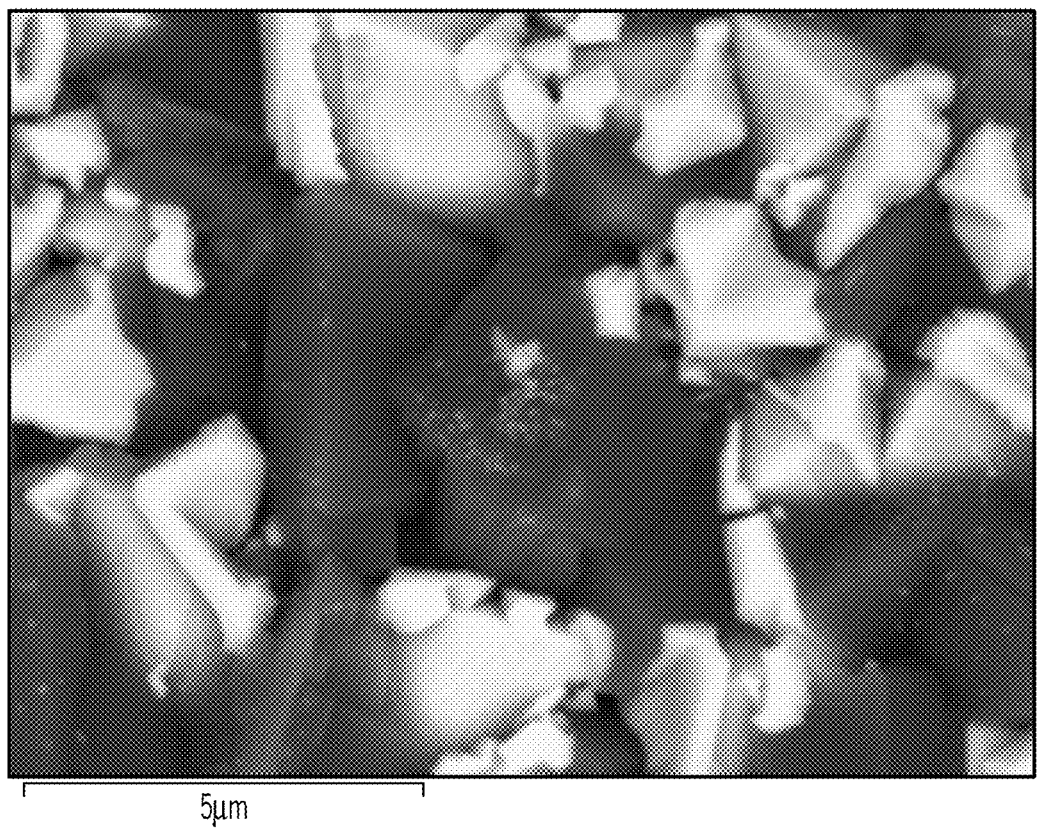

To realize a layer having an alumina matrix and at least one of zirconia grains and hafnia grains in the alumina matrix, a secondary phase beyond the matrix was introduced into a coating system. The introduction manner of the secondary raw source determines the final products. As shown in FIGS. 3A, 3B, and 3C, with a continuous introduction of Zr into the coating system, $Al_2O_3$ and $ZrO_2$ composite can be formed with $ZrO_2$ grains at the micron scale.

To realize a refinement of the secondary phase of $ZrO_2$, the introduction manner of Zr source was introduced with pulse patterns and the ratios between Al/Zr was selected at 1.5 or more. More preferable, the Al/Zr ratios can be over 2. Additionally, after the introduction of Al/Zr mixture, a pure Al environment was used for the $ZrO_2$ grain refinement. The pure Al environment provides for a pure $Al_2O_3$ deposition step that causes the $ZrO_2$ grain refinement by terminating the $ZrO_2$ grains formed with the Al/Zr mixture.

Figure 4A:
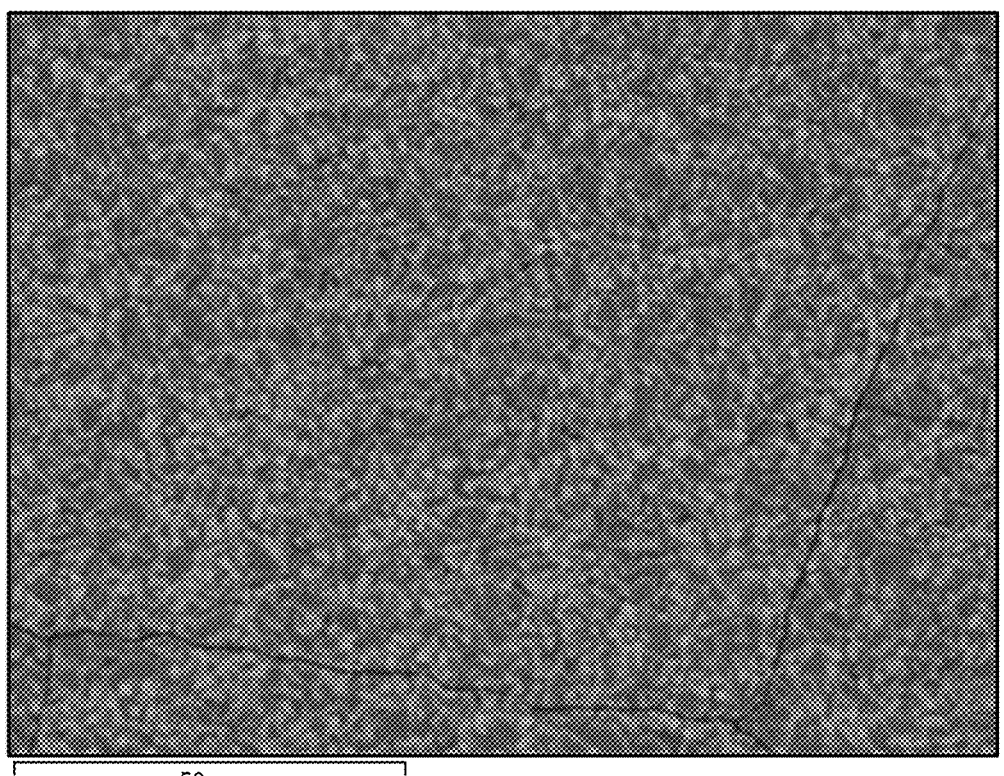
FIGS. 4A, 4B, and 4C are SEM images of nanoscale $ZrO_2$ formed with pulsed introduction of Zr into a coating system and the formed $ZrO_2$ prefer segregated on the grain boundary.
Figure 4B:
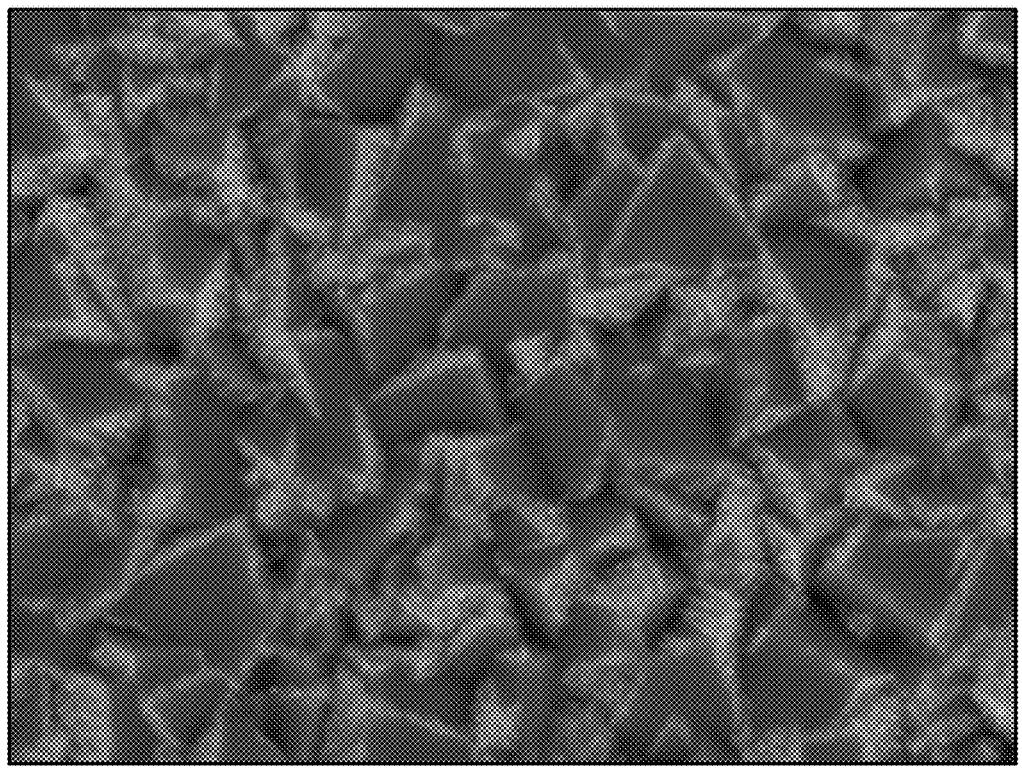
Figure 4C:
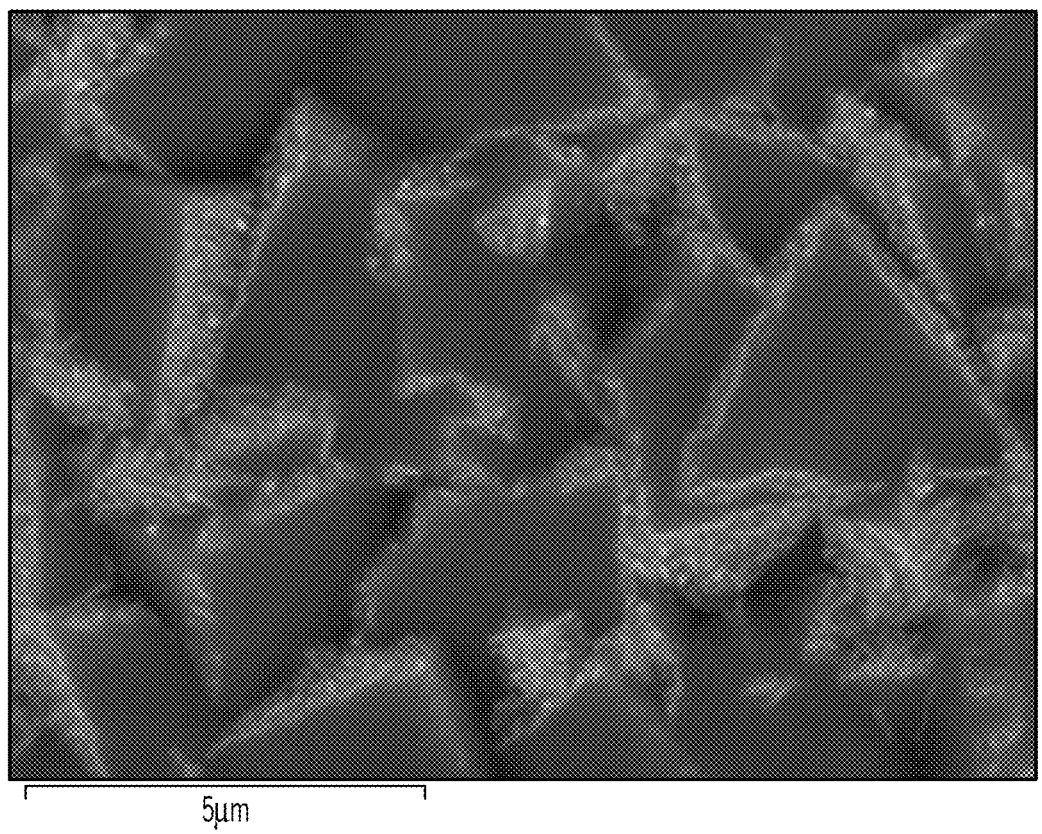

The CVD depositions combine the temperature, gas flow, partial pressures in the reactor, so the coating growth kinetics are dominated by those factors as well. At 850-950° C., the $ZrO_2$ grains formed at an average grain size of less than 100 nm, more favorable at an average grain size of 40-80 nm with grain boundary segregation case, as shown in FIGS. 4A, 4B, and 4C.

Figure 5A:
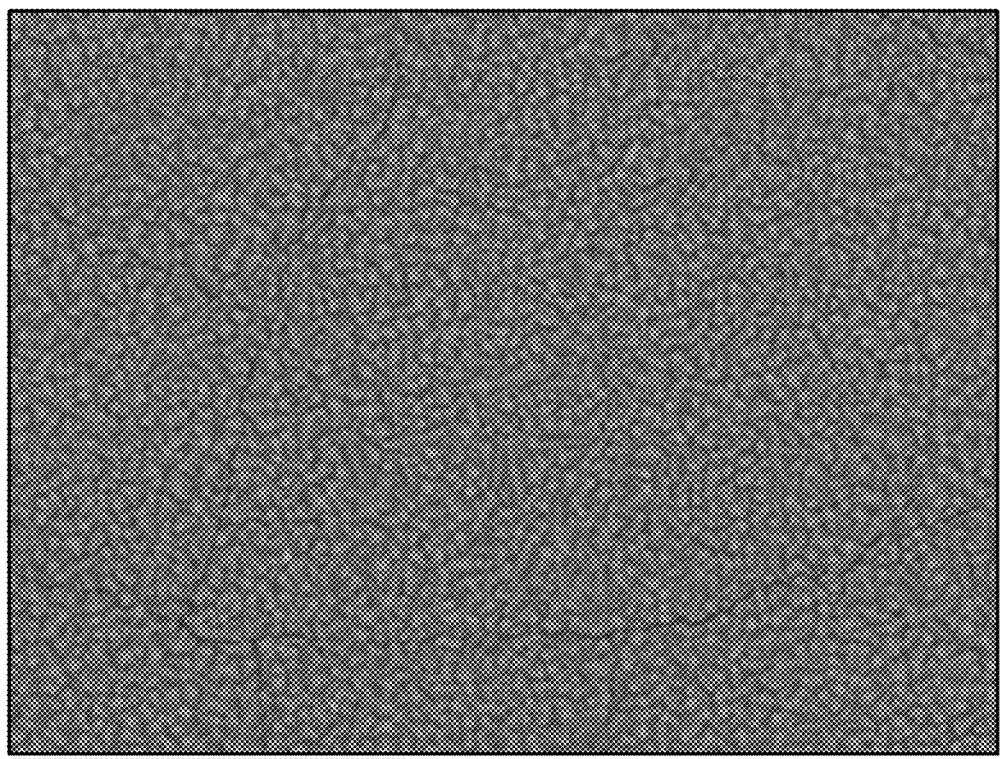
FIGS. 5A, 5B, and 5C are SEM images of nanoscale $ZrO_2$ formed with pulsed introduction of Zr into coating system and the formed $ZrO_2$ with intragranular grain formation and $ZrO_2$ average grain size of less than 100 nm.
Figure 5B:
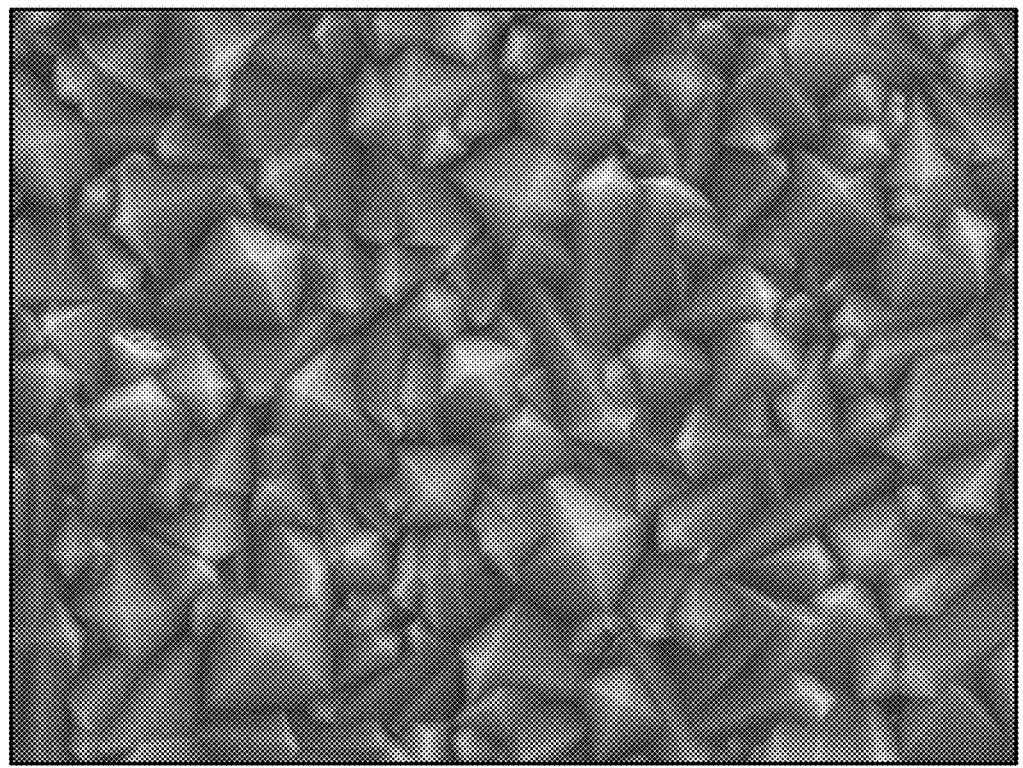
Figure 5C:
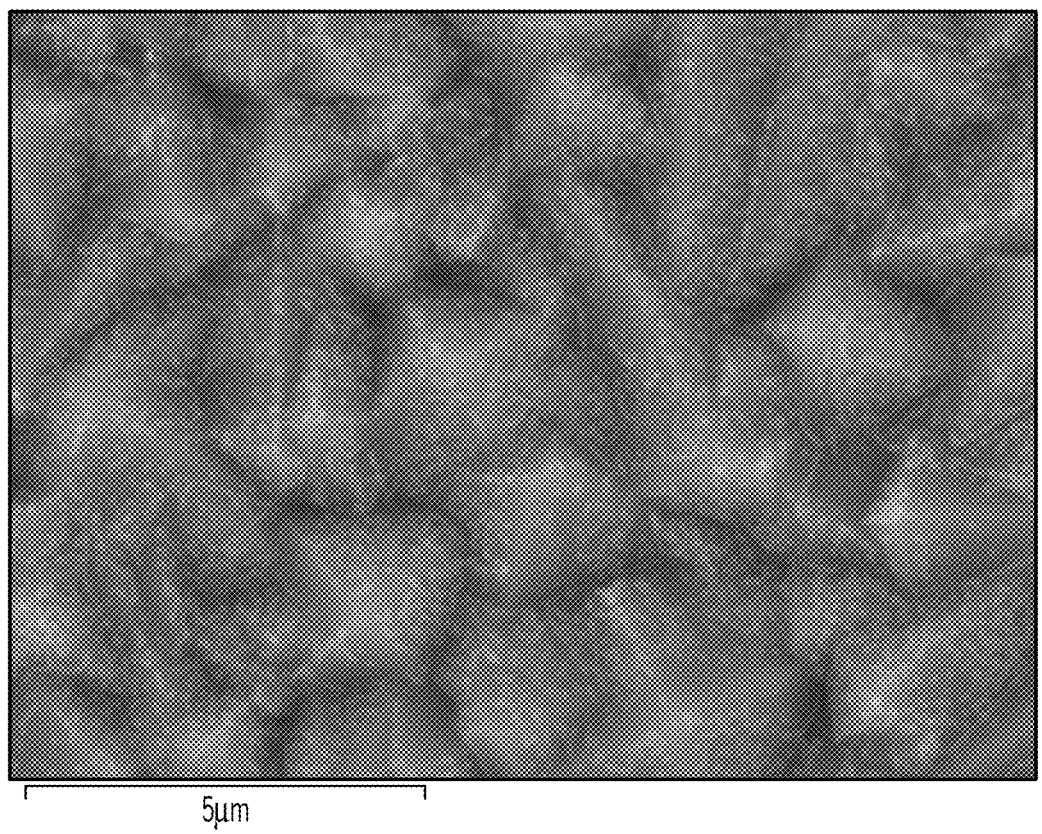

As shown in FIGS. 5A, 5B, and 5C, the formation of nanoscale intragranular grains of secondary phase $ZrO_2$ into $Al_2O_3$ matrix directly by CVD was performed. With control of the deposition conditions, a high $ZrO_2$ density at over 300 per square micron and the $ZrO_2$ grains were formed at an average grain size in the range of 40-100 nm.

The Al/Al+Zr ratios for the pulsed step versus pure Al step, the deposition duration, temperature, the gas flow rate, the introduction of other gas flows, including $H_2S$ and $CO_2$, can play roles on the coating microstructure formations. The ratios of Al/Al+Zr and short deposition time result in fine $ZrO_2$ grains. The temperature may control the atoms diffusion and segregation then lead to the grain boundary enrichment and alumina matrix inclusion. $CO_2$ flow controls the formation of $H_2O$, which determine the reaction kinetics. $H_2S$ is crystal growth promoter and affects the nucleation density and grain growth behavior as well.

Table 1 below describes exemplary, non-limiting, parameters for deposition of an alumina matrix and nanosized zirconia grains and hafnia grains in the alumina matrix using CVD.

TABLE 1

| Layer Composition | Gas Mixture | Temperature (° C.) | Pressure (torr) | Duration (minutes) |
| --- | --- | --- | --- | --- |
| $Al_2O_3$ | $AlCl_3 + H_2 + CO_2 + H_2S$ (optional) + HCl (optional) | 800-1050 | 30-500 | 3-600 |
| $MeAl_2O_3$/ $MeO_2$ | [($AlCl_3 + TiCl_4$ or $ZrCl_4$ or $HfCl_4$) or (their combination)] + $H_2 + CO_2 +$ $H_2S$ (optional) + HCl (optional) | 800-950 or 1020-1050 | 40-60 | 1-15 |

According to the present description, a coated cutting tool includes a substrate and the coating bonded to the substrate. The substrate of the coated cutting tool typically has a rake face, a flank face, and a cutting edge formed at the intersection of the rake face and the flank face.

In one aspect, cutting tools are described comprising refractory coatings employing composite architectures. Cutting tools having such refractory coatings, in some embodiments, are suitable for high wear and/or abrasion applications such as metal cutting operations.

Turning now to specific components, a coated cutting tool includes a substrate. A coated article can comprise any substrate not inconsistent with the objectives of the present description. Cutting tools include, but are not limited to, indexable cutting inserts, end mills, saw blades, or drill bits.

Indexable cutting inserts can have any desired ANSI standard geometry for milling or turning applications. Substrates of coated articles described herein can be formed of cemented carbide, carbide, polycrystalline diamond, polycrystalline cubic boron nitride, ceramic, cermet, steel or other alloy.

A cemented carbide substrate, in some embodiments, comprises tungsten carbide (WC). WC can be present in a cutting tool substrate in any amount not inconsistent with the objectives of the present description. For example, WC can be present in an amount of at least 70 weight percent, in an amount of at least 80 weight percent, or in an amount of at least 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

The cutting tool substrate typically comprises one or more cutting edges formed at the juncture of a rake face and at least one flank face of the substrate. FIG. 1 illustrates a cutting insert substrate according to an example described herein. As illustrated in FIG. 1, the substrate 10 has cutting edges 12 formed at junctions of the substrate rake face 14 and flank faces 16. The substrate 10 also comprises an aperture 18 for securing the substrate 10 to a tool holder. The substrate 10 have a variety of geometries and configurations, e.g. with or without chipbreakers, mounting hole or positive or negative rake angle.

The layer having the alumina matrix and the at least one of zirconia grains and hafnia grains in the alumina matrix can be deposited directly on the substrate surface. Alternatively, a multilayer coating with at least one layer having an alumina matrix and at least one of zirconia grains and hafnia grains in the alumina matrix can further include one or more inner layers between the substrate and the layer having an alumina matrix and at least one of zirconia grains and hafnia grains in the alumina matrix.

One or more inner layers, in some embodiments, may comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. More particularly, the one or more inner layers may comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more inner layers may be selected from the group consisting of titanium nitride, titanium carbonitride, titanium oxycarbonitride, titanium carbide, zirconium nitride, zirconium carbonitride, zirconium oxycarbonitride, zirconium carbide, hafnium nitride and hafnium carbonitride. Further, a layer of titanium oxycarbonitride can be employed as a bonding layer between the one or more inner layers and the layer having the alumina matrix and the at least one of zirconia grains and hafnia grains in the alumina matrix.

The one or more inner layers of the coating can have any thickness not inconsistent with the objectives of the present description. For example, a single inner layer can have a thickness of at least 1.5 μm. Alternatively, a plurality of inner layers can collectively achieve thickness of at least 1.5 μm.

Table 2 below describes exemplary parameters for deposition of exemplary inner layers using CVD.

TABLE 2

| Inner Layer Composition | Gas Mixture | Temperature (° C.) | Pressure (torr) | Duration (minutes) |
|---|---|---|---|---|
| TiN | $H_2$, $N_2$, $TiCl_4$ | 800-900 | 60-300 | 20-120 |
| TiCN(MT) | $H_2$, $N_2$, $TiCl_4$, $CH_3CN$ | 750-900 | 30-300 | 60-300 |
| TiCN(HT) | $H_2$, $N_2$, $TiCl_4$, $CH_4$ | 900-1050 | 30-300 | 30-200 |
| TiC | $H_2$, $TiCl_4$, $CH_4$ | 900-1050 | 30-300 | 30-200 |
| TiOCN | $H_2$, $N_2$, $TiCl_4$, $CH_4$, CO | 900-1050 | 60-500 | 30-300 |
| ZrN | $H_2$, $N_2/NH_3$, $ZrCl_4$ | 800-900 | 60-300 | 20-120 |
| ZrCN(MT) | $H_2$, $N_2$, $ZrCl_4$, $CH_3CN$ | 750-900 | 30-300 | 60-300 |
| ZrCN(HT) | $H_2$, $N_2$, $ZrCl_4$, $CH_4$ | 900-1050 | 30-300 | 30-200 |
| ZrC | $H_2$, $ZrCl_4$, $CH_4$ | 900-1050 | 30-300 | 30-200 |
| ZrOCN | $H_2$, $N_2$, $ZrCl_4$, $CH_4$, CO | 900-1050 | 60-500 | 30-300 |

The layer having the alumina matrix and the at least one of zirconia grains and hafnia grains in the alumina matrix can be the outermost layer of the coating. Alternatively, a coating described herein can comprise one or more outer layers over the layer having the alumina matrix and the at least one of zirconia grains and hafnia grains in the alumina matrix. The one or more outer layers can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. More particularly, the one or more outer layers can comprise a carbide, nitride, carbonitride, oxycarbonitride, oxide or boride of one or more metallic elements selected from the group consisting of aluminum and metallic elements of Groups IVB, VB and VIB of the Periodic Table. For example, the one or more outer layers may be selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

The one or more outer layers described herein can have any thickness not inconsistent with the objectives of the present description. A coating outer layer, in some embodiments, can have a thickness ranging from 0.2 μm to 5 μm.

Coatings described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting and steam blasting. Wet blasting, for example, is accomplished using a slurry of inorganic and/or ceramic particles, such as alumina, and water. The particle slurry can be pneumatically projected at a surface of the coated cutting tool body to impinge on the surface of the coating. The inorganic and/or ceramic particles can generally range in size between 20 μm and 100 μm.

Blasting parameters include pressure, angle of impingement, distance to the part surface and duration. In some embodiments, angle of impingement can range from 5 degrees to 90 degrees, i.e., the particles impinge the coating surface at an angle ranging from 5 degrees to 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the coating by any apparatus not inconsistent with the objectives of the present description, such as brushes. In one embodiment, for example, a flat brush is used to apply grit paste to the coating in a workpiece contact area of the cutting tool.

A coating described herein can be blasted or polished for a time period sufficient to achieve a desired surface roughness and/or other parameters such as reducing residual tensile stress in the coating.

Further, a post-coat treatment, in some embodiments, does not remove one or more outer layers of the coating, such as outer layers of TiN, TiCN, TiOCN, TiC, ZrN, ZrC, ZrCN, ZrOCN, HaN, HaC, HaCN and/or HaOCN. Alternatively, a post-coat treatment can remove or partially remove one or more outer layers.

Table 3 below describes exemplary properties for coatings comprising the layer having the alumina matrix and the at least one of zirconia grains and hafnia grains in the alumina matrix having the average grain size of 100 nm or less.

TABLE 3

| Example | A | B |
|---|---|---|
| TiN Thickness (μm) | 0.4 | 0.4 |
| MT-TiCN Thickness (μm) | 7.9 | 8.6 |
| HT-TiCN/TiOCN Thickness (μm) | 1.0 | 0.9 |
| $Al_2O_3$—$ZrO_2$ Nanocomp Thickness (μm) | 8.2 | 8.8 |
| Total (μm) | 17.5 | 18.7 |
| Zr/(Zr + Al) Ratio | 0.3-0.6 | 0.4-0.8 |
| Temperature ° C. | 850-950 | 1020-1050 |
| $H_2S/CO_2$ Ratio | 0.04 | 0.02 |

Example A demonstrates the case of grain boundary segregation and Example B demonstrates the case of secondary phase inclusion into $Al_2O_3$ matrix.

Although various embodiments of the disclosed coating and coated cutting insert have been shown and described, modifications may occur to those skilled in the art upon reading the specification. The present application includes such modifications and is limited only by the scope of the claims.

What is claimed is:

1. A coating, comprising:
   a layer deposited by thermal chemical vapor deposition (CVD) having an alumina matrix and at least one of zirconia grains and hafnia grains in the alumina matrix, wherein an average grain size of the at least one of the zirconia grains and hafnia grains is 100 nm or less.

2. The coating of claim 1, wherein the average grain size of the at least one of the zirconia grains and hafnia grains is in a range of 1 nm to 80 nm.

3. The coating of claim 1, wherein the average grain size of the at least one of the zirconia grains and hafnia grains is in a range of 1 nm to 40 nm.

4. The coating of claim 1, wherein the average grain size of the at least one of the zirconia grains and hafnia grains is in a range of 40 nm to 80 nm.

5. The coating of claim 1, wherein the at least one of the zirconia grains and hafnia grains includes grains having at least one of a tetragonal, monoclinic, and orthorhombic crystal structure.

6. The coating of claim 1, wherein the at least one of the zirconia grains and hafnia grains are primarily disposed within grains of the alumina matrix.

7. The coating of claim 1, wherein the at least one of the zirconia grains and hafnia grains are primarily disposed at grain boundaries of the alumina matrix.

8. The coating of claim 1, wherein the CVD layer has a thickness of 0.1 μm to 25 μm.

9. The coating of claim 1, wherein the alumina matrix comprises alumina grains having an average size of at least 200 nm.

10. The coating of claim 1, wherein the alumina matrix comprises alumina grains having an average size of at least 500 nm.

11. A coated cutting tool, comprising:
    a substrate having a rake face, a flank face, and a cutting edge formed at the intersection of the rake face and the flank face; and
    a coating bonded to the substrate, the coating comprising a layer deposited by thermal chemical vapor deposition (CVD) having an alumina matrix and at least one of zirconia grains and hafnia grains in the alumina matrix, wherein an average grain size of the at least one of the zirconia grains and hafnia grains is 100 nm or less.

12. The coated cutting tool of claim 11, wherein the average grain size of the at least one of the zirconia grains and hafnia grains is in a range of 1 nm to 80 nm.

13. The coated cutting tool of claim 11, wherein the average grain size of the at least one of the zirconia grains and hafnia grains is in a range of 1 nm to 40 nm.

14. The coated cutting tool of claim 11, wherein the average grain size of the at least one of the zirconia grains and hafnia grains is in a range of 40 nm to 80 nm.

15. The coated cutting tool of claim 11, wherein the at least one of the zirconia grains and hafnia grains includes grains having at least one of a tetragonal, monoclinic, and orthorhombic crystal structure.

16. The coated cutting tool of claim 11, wherein the at least one of the zirconia grains and hafnia grains are primarily disposed within grains of the alumina matrix.

17. The coated cutting tool of claim 11, wherein the at least one of the zirconia grains and hafnia grains are primarily disposed at grain boundaries of the alumina matrix.

18. The coated cutting tool of claim 11, wherein the CVD layer has a thickness of 0.1 μm to 25 μm.

19. The coated cutting tool of claim 11, wherein the alumina matrix comprises alumina grains having an average size of at least 200 nm.

20. The coated cutting tool of claim 11, wherein the alumina matrix comprises alumina grains having an average size of at least 500 nm.

* * * * *